United States Patent
Byun et al.

(10) Patent No.: US 7,977,223 B2
(45) Date of Patent: Jul. 12, 2011

(54) METHOD OF FORMING NITRIDE SEMICONDUCTOR AND ELECTRONIC DEVICE COMPRISING THE SAME

(75) Inventors: Dong-Jin Byun, Seoul (KR); Bum-Joon Kim, Seoul (KR); Jung-Geun Jhin, Gwangju (KR); Jong-Hyeob Baek, Daejeon (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 22 days.

(21) Appl. No.: 12/431,576

(22) Filed: Apr. 28, 2009

(65) Prior Publication Data

US 2010/0065865 A1      Mar. 18, 2010

(30) Foreign Application Priority Data

Sep. 18, 2008   (KR) .................. 10-2008-0091436

(51) Int. Cl.
*H01L 21/265* (2006.01)
(52) U.S. Cl. ................... 438/518; 257/E21.12
(58) Field of Classification Search .......... 438/518; 257/E21.12
See application file for complete search history.

(56) References Cited

U.S. PATENT DOCUMENTS

2009/0215248 A1* 8/2009 Nakahata et al. ........ 438/481
* cited by examiner

*Primary Examiner* — W. David Coleman (57) ABSTRACT

A method of forming a nitride semiconductor through ion implantation and an electronic device including the same are disclosed. In the method, an ion implantation region composed of a line/space pattern is formed on a substrate at an ion implantation dose of more than 1E17 ions/cm$^2$ to 5E18 ions/cm$^2$ or less and an ion implantation energy of 30~50 keV, and a metal nitride thin film is grown on the substrate by epitaxial lateral overgrowth, thereby decreasing lattice defects in the metal nitride thin film. Thus, the electronic device has improved efficiency.

14 Claims, 13 Drawing Sheets

METHOD OF FORMING NITRIDE SEMICONDUCTOR AND ELECTRONIC DEVICE COMPRISING THE SAME

BACKGROUND OF THE INVENTION

1. Field of the Invention

The present invention relates to a method of forming a nitride semiconductor having improved quality of a metal nitride thin film via surface treatment capable of reducing dislocations in the thin film during growth of the metal nitride thin film.

2. Description of the Related Art

In recent years, replacement of conventional illumination with high efficiency semiconductor illumination has been promoted due to increased concern over energy issues relating to depletion of fossil fuels. Further, under the fierce competition for high-speed information processing technology, an attempt for application of gallium nitride (GaN) to high electron mobility transistors (HEMT) or power switch devices operating at high speeds has also been actively made in the field of information technology.

A GaN thin film having a Wurtzite structure has a direct transition type band gap of 3.4 eV at room temperature, and can be usefully applied to light emitting diodes (LEDs) and laser diodes (LDs) that emit light in the range of blue color and ultraviolet rays.

Particularly, the GaN thin film permits the formation of continuous solid solutions along with indium nitride (InN) and aluminum nitride (AlN), which have the Wurtzite structure like the GaN thin film and band gaps of 1.9 eV and 6.2 eV, respectively.

The GaN thin film permits wavelength adjustment according to an active energy and doping concentration of an impurity, and forms ternary nitrides depending on composition to facilitate manufacture of visible light emitting diodes having a wide range of wavelengths, so as to be applicable to a wide range of applications.

However, regardless of the wide range of applications of the GaN thin film, the properties of the GaN thin film make it very difficult to fabricate the GaN thin film into a bulk-type single crystal substrate such as an ingot.

Currently, the GaN thin film is formed through epitaxial growth on a substrate by Metal Organic Chemical Vapor Deposition (MOCVD).

Here, since the GaN thin film is generally formed through hetero-epitaxial growth rather than homo-epitaxial growth, selection of an appropriate substrate is critical.

In particular, a sapphire ($\alpha\text{-}Al_2O_3$) substrate and an SiC substrate are generally employed as heterogeneous substrates for use in growth of the GaN thin film. However, lattice mismatches of 16% and 3.5% between the respective heterogeneous substrates and gallium nitride for the a-axis cause mismatch dislocation, which is created from an early stage of thin film growth, and other defects, such as threading dislocation, stacking fault, inversion domain boundary, and the like.

Since such defects are very important factors in determining lifespan and luminescence efficiency of diodes, various attempts have been made to remove or suppress the defects.

For example, a buffer layer is conventionally used to prevent the formation of defects. Typically, a buffer layer of aluminum nitride or gallium nitride is used. That is, such a non-crystalline or polycrystalline buffer layer provides many nucleation sites, which have the same crystallinity as those of the substrates, thereby facilitating two-dimensional growth of gallium nitride while promoting lateral growth thereof through reduction in interfacial energy between the thin film and the substrates.

However, since the buffer layer of aluminum nitride or gallium nitride is formed by nitride treatment through MOCVD or molecular beam epitaxy before crystal growth of the gallium nitride thin film, such nitride treatment causes surface roughening of the gallium nitride thin film according to treatment duration, thereby deteriorating quality of the gallium nitride thin film.

In other words, since non-crystalline compounds are generated to form protrusions on the surface of the sapphire substrate subjected to nitride treatment, it can be understood that the conventional process provides different results depending on whether process conditions are optimized or not. Thus, the conventional method inevitably requires very careful control of the process upon crystal growth of gallium nitride.

To solve such problems, a technique for Epitaxial Lateral Overgrowth (ELOG) of a gallium nitride crystal has been studied. For epitaxial lateral overgrowth of the gallium nitride crystal, a mask having a periodic pattern is formed on a substrate or a GaN buffer layer, followed by growing gallium nitride to a thickness of the mask layer or more on a region of the substrate where the mask is not formed, that is, on a window region, and laterally growing a gallium nitride thin film over the mask. The gallium nitride film formed by the epitaxial lateral overgrowth has a significantly reduced density of threading dislocations, thereby enhancing chip performance.

However, the epitaxial lateral overgrowth generally requires re-growth. For example, when forming the gallium nitride thin film on the sapphire substrate through the epitaxial lateral overgrowth, it is above all necessary to form a gallium nitride buffer layer at a low temperature. When the gallium nitride buffer layer is grown at low temperatures, the GaN buffer layer is undesirably grown on the surface of the mask as well as on the window region, thereby providing an obstacle in epitaxial lateral overgrowth.

Accordingly, in the conventional technique it is necessary for the epitaxial lateral overgrowth to be performed after growing the mask on sapphire substrate/low temperature GaN/high temperature GaN layers. Further, an insulation layer used as the mask is likely to generate stress in the GaN thin film and is a potential impurity, which can act as a contaminant. Moreover, if nucleation occurs at a high speed on the mask, some of the GaN layer may not meet the other GaN layer on the mask during the epitaxial lateral overgrowth, thereby requiring an additional process condition for achieving rapid epitaxial lateral overgrowth.

SUMMARY OF THE INVENTION

The present invention is conceived to solve the problems as described above, and an aspect of the present invention is to provide a method of forming a nitride semiconductor through ion implantation, and an electronic device including the same. In the method, an ion implantation region is formed in a line/space shape on a region of a substrate, where a mask pattern has been formed for epitaxial lateral overgrowth in the related art, and an ion implantation dose is adjusted to obtain effective epitaxial lateral overgrowth of a metal nitride thin film, thereby reducing dislocation density in the metal nitride thin film while ensuring stable crystallinity of the metal nitride thin film.

According to an aspect of the present invention, a method of forming a nitride semiconductor includes: forming an ion implantation region of a line/space pattern on a surface of a substrate at an ion implantation dose of more than 1E17 ions/cm$^2$ to 5E18 ions/cm$^2$ or less and an ion implantation energy of 30~50 keV; forming an In$_x$Al$_y$Ga$_{1-x-y}$N layer (0.3≧x≧0, y≧0.1, x+y≦1) on the surface of the substrate; and forming a metal nitride thin film over the surface of the substrate including the In$_x$Al$_y$Ga$_{1-x-y}$N layer by allowing the metal nitride thin film to grow from an upper portion of the space pattern to an upper portion of the line pattern through epitaxial lateral overgrowth.

The substrate may be one selected from a Si substrate, a sapphire substrate, a SiC substrate, a GaAs substrate, an InP substrate, and a Ge substrate. An ion implanted into the ion implantation region may be one selected from the group consisting of N, C, B, Be, Li, Mg, O, F, S, P, As, Sr, Te, and compounds thereof. The ion implantation region may be formed to a depth of 50 mm~1 μm from the surface of the substrate. The ion implantation region may be formed to a depth of 50 mm~200 nm. The metal nitride thin film may comprise at least one material selected from GaN, InGaAlN, InGaN, AlGaN and AlN. The metal nitride thin film may be formed by one selected from Metal Organic Chemical Vapor Deposition (MOCVD), Molecular Beam Epitaxy (MBE), Hydride Vapor Phase Epitaxy (HVPE), and Atomic Layer Deposition (ALD). The metal nitride thin film may be grown to have an XRD (X-ray Defractometry) full-width at half-maximum of 820 arcsec or less. The method may further include forming a lower cladding layer, an active layer, and an upper cladding layer on the metal nitride thin film in this order.

In accordance with another aspect of the present invention, an electronic device is manufactured using a nitride semiconductor including the metal nitride thin film. The electronic device may be one of a light emitting diode, a Heterojunction Field-Effect Transistor (HEMT), a Heterojunction Bipolar Transistor (HBT), and a laser diode.

In accordance with a further aspect of the present invention, an electronic device includes a chip fabricated by dicing a nitride semiconductor including the metal nitride thin film into individual chips and separating the individual chips from each other; a lead frame having the chip mounted thereon; a cathode connected to the lead frame; an anode separated from the cathode and connected to the chip via a gold wire; and an epoxy resin protecting the chip, the lead frame and an upper portion of the anode connected to the gold wire while serving as a lens which radiates light.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION OF THE EMBODIMENT

Exemplary embodiments of the present invention will be described in detail with reference to the accompanying drawings.

However, it should be noted that the present invention is not limited to the embodiments and can be realized in various forms, and that the embodiments are given by way of illustration for thorough understanding of the present invention by those skilled in the art. Therefore, the present invention is defined only by the accompanying claims. Like elements will be denoted by like reference numerals throughout the specification According to an embodiment of the present invention, a single crystal substrate for use in fabrication of a metal nitride thin film is a silicon substrate or a sapphire substrate, and has an ion implantation region of a line/space pattern on the surface thereof.

Here, since a single crystal silicon substrate can minimize lattice mismatch between gallium nitride and a heterogeneous crystal, it is suitable as a substrate for use in fabrication of the metal nitride thin film. The ion implantation region is formed by repetitiously forming a line pattern part subjected to ion implantation treatment and a space part not subjected to the ion implantation treatment in a regular manner on the same plane, so that the single crystal substrate for the metal nitride thin film may have both a non-crystalline region and a crystalline region on the same plane. In other words, two phases are formed on the same plane, so that an epitaxial growth layer can be grown at different growth speeds in different growth modes on the two phases. The line pattern part (non-crystalline region) subjected to the ion implantation serves to relieve the lattice mismatch through surface modification. However, since the line pattern part is a non-crystalline region with a silicon lattice distorted by impact, the growth speed of the epitaxial layer can be retarded thereon.

On the other hand, although the space part (crystalline region) not subjected to the ion implantation does not relieve the lattice mismatch, the space part allows more rapid growth of the epitaxial layer than the pattern part, so that the epitaxial layer can grow toward the line pattern part in the lateral direction as well as in the vertical direction.

According to the present invention, since the line/space pattern is repetitiously formed on the silicon substrate, epitaxial lateral overgrowth occurs simultaneously from the space parts at opposite sides of the line pattern part, so that the epitaxial layer grown by the lateral overgrowth meets the surface of the epitaxial layer grown vertically on the line pattern part. As such, portions of the epitaxial layers meeting each other on the silicon substrate have the same crystal structure, thereby providing advantageous effects to the thin film in terms of lattice mismatch.

Figure 1:
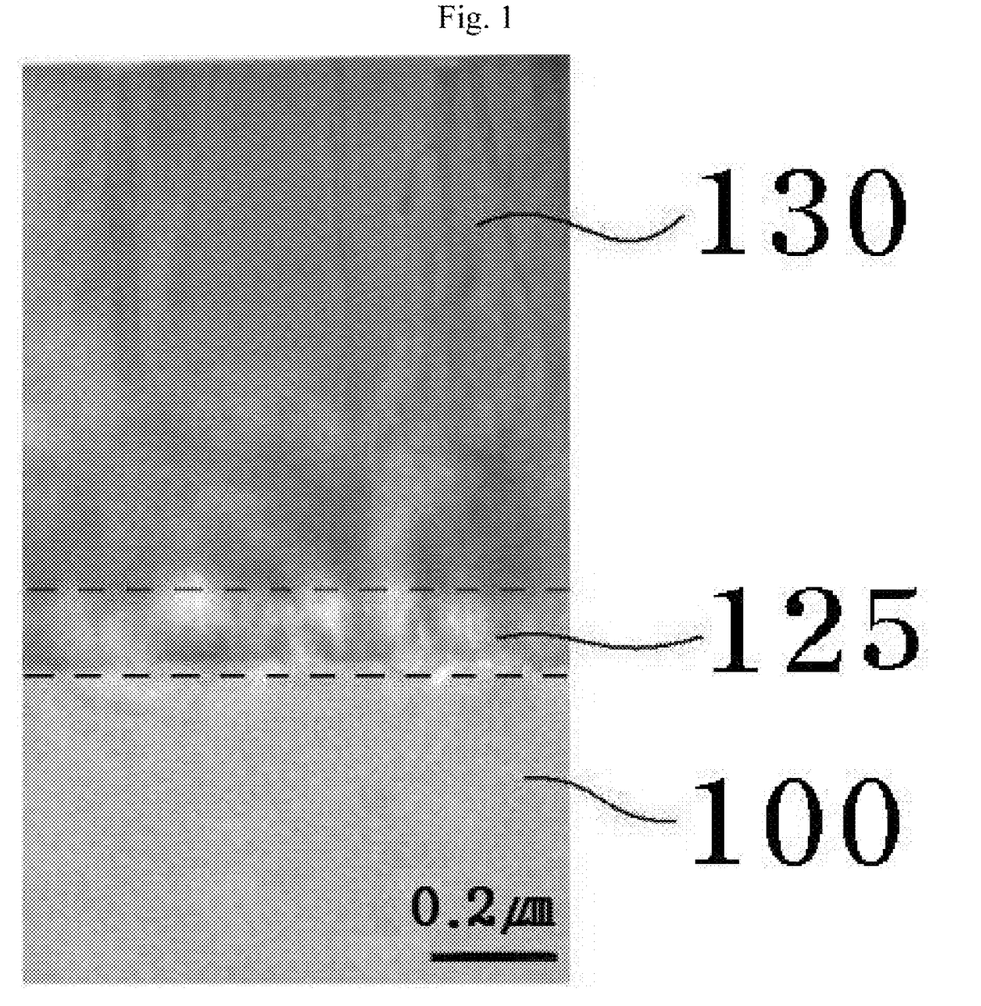
FIGS. 1 and 2 are TEM (Transmission Electron Microscope) micrographs of a metal nitride thin film formed on a silicon substrate according to an embodiment of the present invention.
Figure 2:
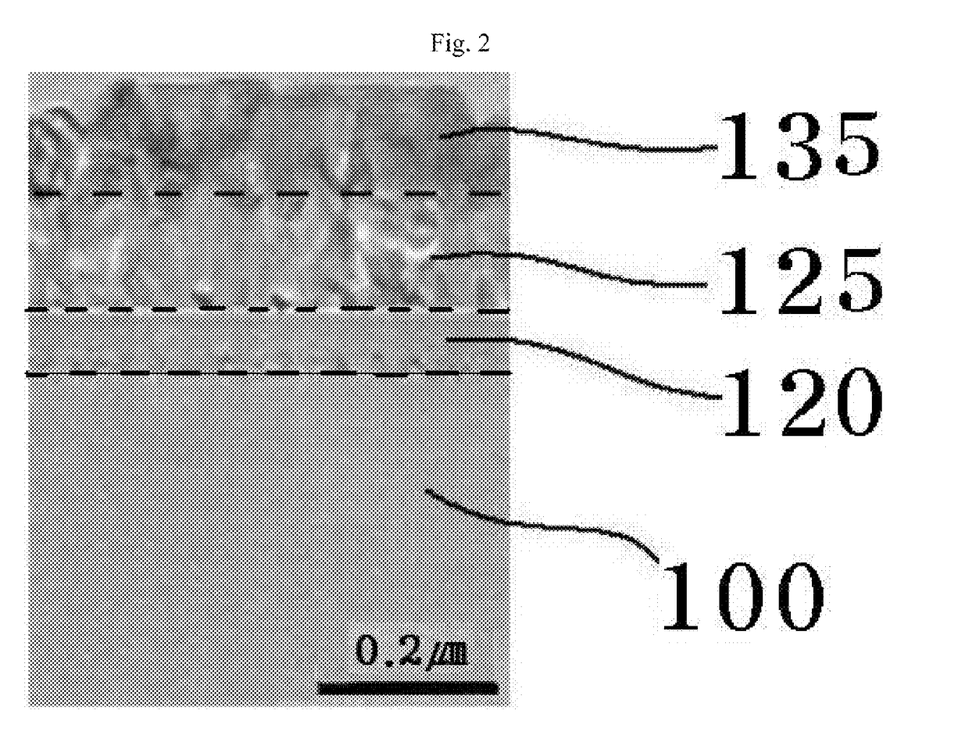

FIGS. 1 and 2 are TEM micrographs of a metal nitride thin film formed on a silicon substrate according to an embodiment of the present invention, for comparing a growth speed of the metal nitride thin film upon ion implantation into the silicon substrate in the case of non ion implantation.

Referring to FIG. 1, a metal nitride thin film 130 is formed on a silicon substrate 100 without forming an ion implantation region thereon. An AlN layer 125 is formed between the metal nitride thin film 130 and the silicon substrate 100 to facilitate growth of the metal nitride thin film 130. Other layers constituting an LED will also be formed on the metal nitride thin film 130.

Referring to FIG. 2, an ion implantation region 120, an AlN layer 125, and a metal nitride thin film 135 are sequentially formed on the surface of a silicon substrate 100. Here, the metal nitride thin film 135 is grown in a polycrystalline shape.

Comparing FIG. 1 with FIG. 2, the metal nitride thin film 130 of FIG. 1 where the ion implantation region 120 is not formed is about 5~10 times thicker than the metal nitride thin film 135 of FIG. 2. As a result, it can be seen that the ion implantation region formed on the silicon substrate according to the present invention enables epitaxial lateral overgrowth of the metal nitride thin film without using a mask, which is formed of $SiO_2$ or $Si_3N_4$ in a conventional technique.

Figure 3:
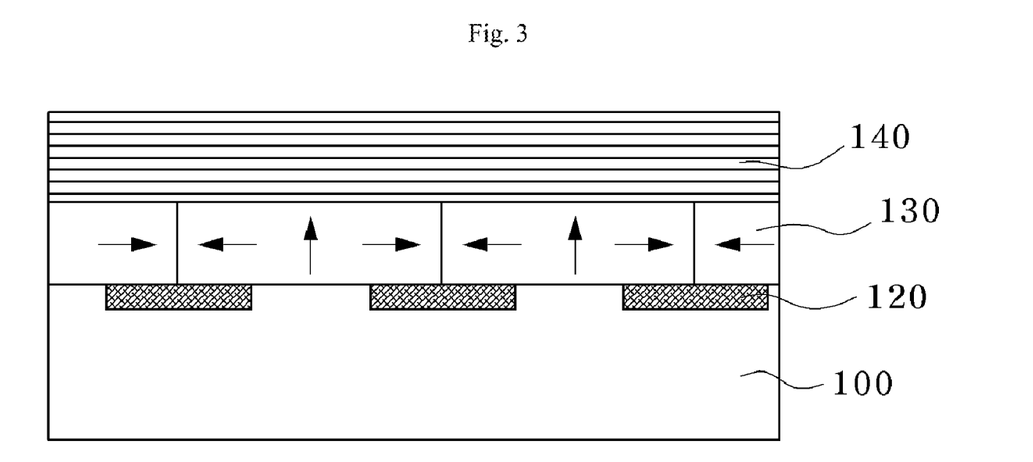
FIG. 3 is a sectional view illustrating a method of forming a nitride semiconductor according to an embodiment of the present invention.

FIG. 3 is a sectional view illustrating a method of forming a nitride semiconductor according to an embodiment of the present invention.

Referring to FIG. 3, an ion implantation region 120 composed of a line/space pattern is formed on the surface of a substrate 100. The substrate 100 may be a silicon (Si) substrate or a sapphire substrate.

Here, if the line/space pattern is formed perpendicular to a [1-10] crystal orientation of the silicon substrate when formed on the silicon substrate, the lateral overgrowth speed of the metal nitride thin film becomes very slow. Thus, it is important to accurately maintain the orientation of the line/space pattern.

An exemplary method of forming a gallium nitride thin film on a silicon substrate will be described hereafter.

Figure 4:
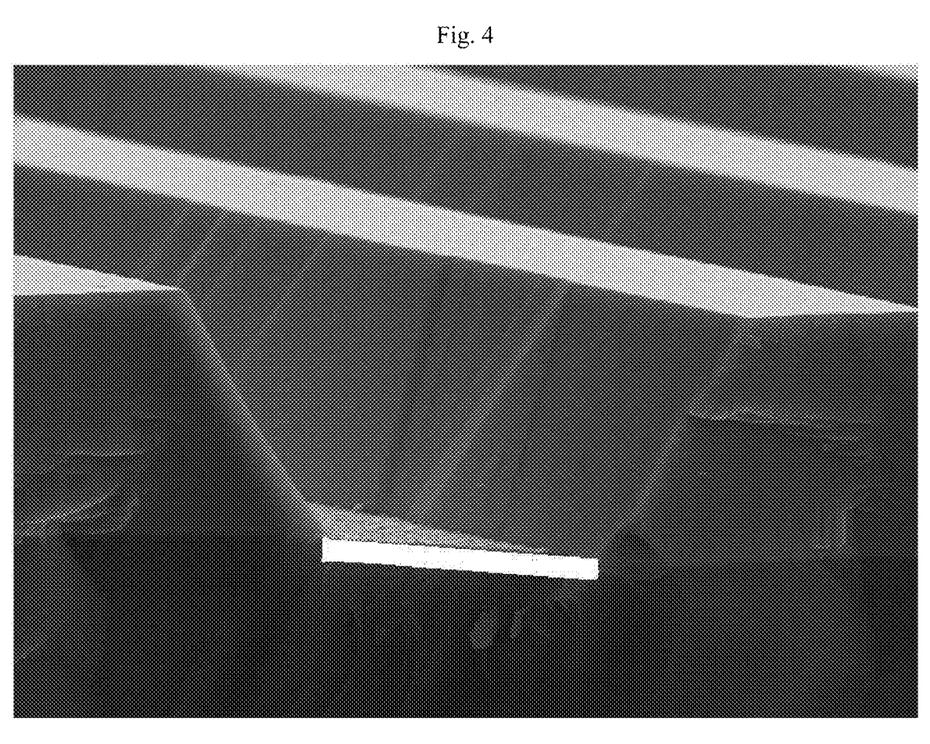
FIG. 4 is an SEM (Scanning Electron Microscope) micrograph of a metal nitride thin film formed on a silicon substrate when a line/space pattern is formed perpendicular to a [1-10] crystal orientation of the silicon substrate.

FIG. 4 is an SEM micrograph of a metal nitride thin film formed on a silicon substrate when a line/space pattern is formed perpendicular to the [1-10] crystal orientation of the silicon substrate.

The SEM micrograph of FIG. 4 was taken when the metal nitride thin film was grown to a thickness of 4 μm, and shows that the metal nitride thin film was not substantially formed on the ion implantation region since epitaxial lateral overgrowth of the metal nitride thin film was minimal thereon. Thus, it can be understood that the orientation of the line/space pattern is an important factor determining the lateral overgrowth speed of the metal nitride thin film.

According to an embodiment of the invention, an ion implanted into the ion implantation region 120 is one selected from the group consisting of N, C, B, Be, Li, Mg, O, F, S, P, As, Sr, Te, and compounds thereof. For ion implantation, an ion implantation dose may be adjusted to exceed 1E17 ions/$cm^2$ to 5E18 ions/$cm^2$ or less, and an implantation energy may be adjusted to be in the range of 30~50 keV. Under this condition, the ion implantation region 120 may be formed to a depth of 50 nm~1 μm from the surface of the silicon substrate 100, and may be formed to a depth of 50 nm~200 nm therefrom.

Figure 5A:
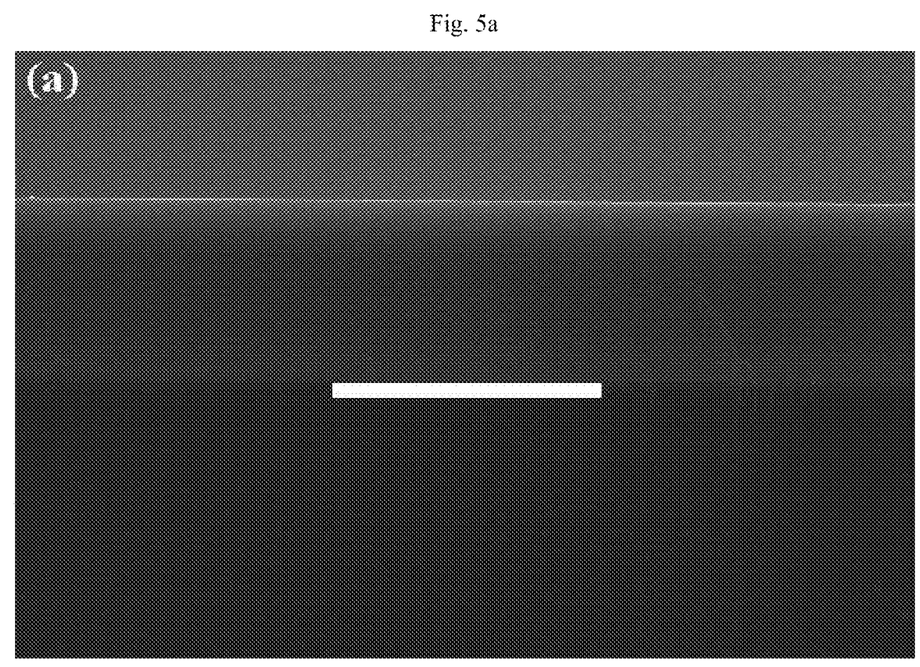
FIG. 5a to 5c are SEM micrographs of metal nitride thin films grown after a nitrogen ion implantation region is formed perpendicular to a [1-10] crystal orientation of a silicon substrate.
Figure 5B:
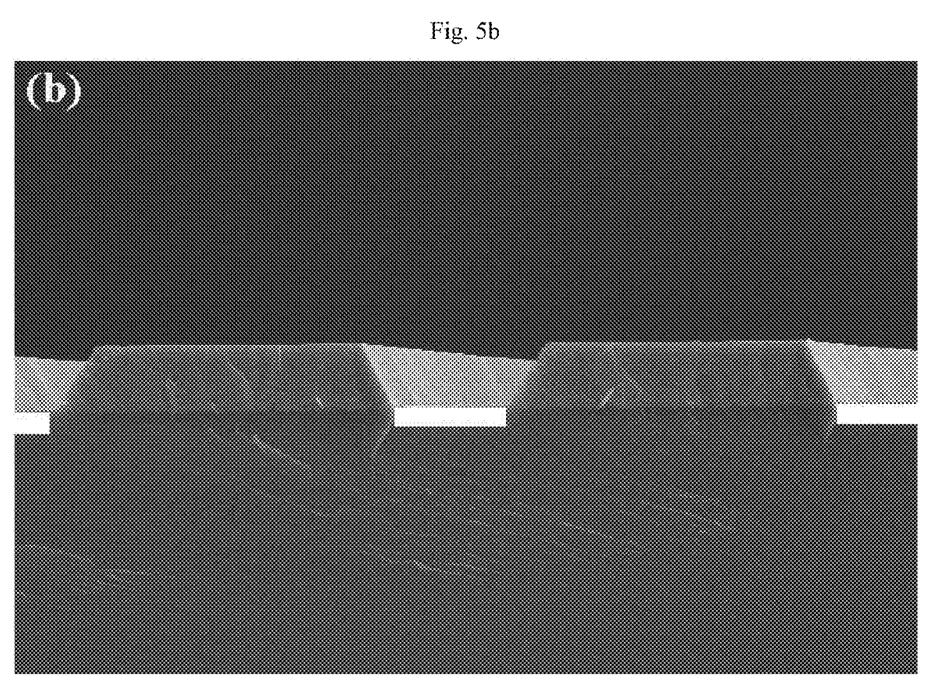
Figure 5C:
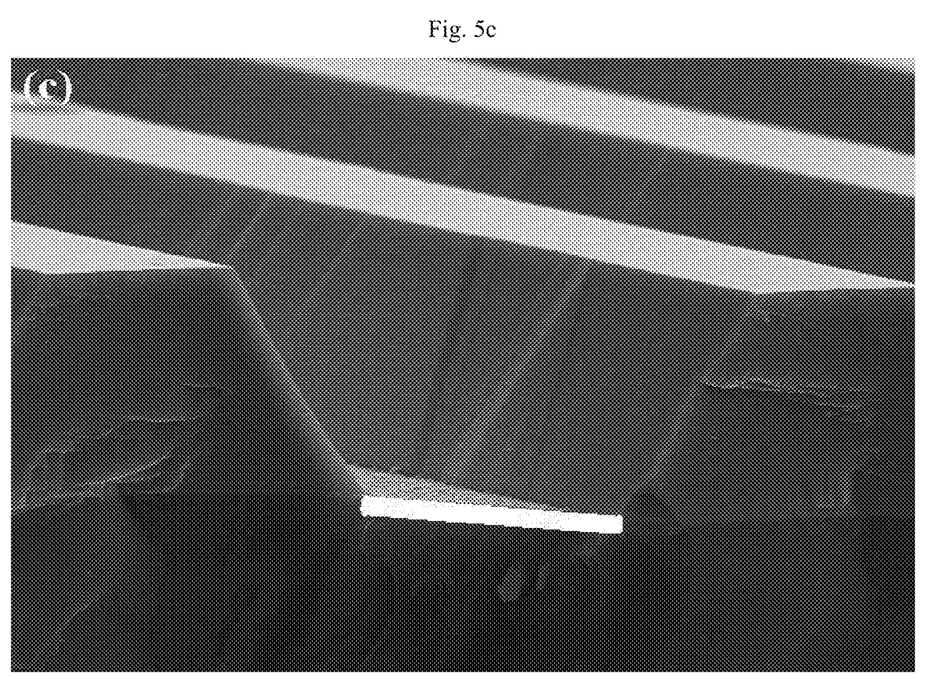

FIG. 5a to 5c are SEM micrographs of a metal nitride thin film grown after a nitrogen ion implantation region is formed perpendicular to the [1-10] crystal orientation of the silicon substrate.

As described above, in the process of growing the metal nitride thin film according to the present invention, it is desirable that the ion implantation region be formed parallel to the [1-10] crystal orientation of the silicon substrate. In FIGS. 5a to 5c, however, to determine an ion implantation dose at which the metal nitride thin film is not grown vertically, the ion implantation region was orientated to slow epitaxial lateral overgrowth of the metal nitride thin film.

FIG. 5a shows a metal nitride thin film grown after the ion implantation region was formed at an ion implantation dose of 9.9E16 ions/$cm^2$, FIG. 5b shows a metal nitride thin film grown after the ion implantation region was formed at an ion implantation dose of 1E17 ions/$cm^2$, and FIG. 5c shows a metal nitride thin film grown after the ion implantation region was formed at an ion implantation dose of 5E18 ions/$cm^2$.

As shown in FIG. 5a, when the ion implantation region was formed at an ion implantation dose of 9.9E16 ions/$cm^2$, the ion implantation region did not provide any influence on the epitaxial lateral overgrowth of the metal nitride thin film, so that the metal nitride thin film was grown at the same speed as that in a region not subjected to ion implantation. As such, since the metal nitride thin film can suffer crystal defects when grown in the vertical direction, it is necessary to increase the ion implantation dose above 9.9E16 ions/$cm^2$.

It can be seen from FIG. 5b that vertical growth of the metal nitride thin film did not substantially occur on the ion implantation region formed at an ion implantation dose of 1E17 ions/$cm^2$. Thus, when the ion implantation dose exceeds 1E17 ions/$cm^2$, the metal nitride thin film can be formed on the ion implantation region only by the epitaxial lateral overgrowth.

Further, it can be seen from FIG. 5c that the vertical growth layer was formed again from the surface of the silicon substrate in the ion implantation region when the ion implantation dose was 5E18 ions/$cm^2$. Hence, according to the present invention, the ion implantation dose may be adjusted to exceed 1E17 ions/$cm^2$ to 5E18 ions/$cm^2$ or less.

Furthermore, to ensure stable bonding of the metal nitride thin films grown at the opposite sides of the ion implantation region, the ion implantation dose may be adjusted to exceed 1E17 ions/$cm^2$ to 5E18 ions/$cm^2$ or less.

If the ion implantation dose is 1E17 ions/$cm^2$ or less, the epitaxial lateral overgrowth of the metal nitride thin film is insufficiently performed, so that the metal nitride thin film cannot obtain a complete thin film shape and can be formed with grooves on the surface thereof. If the ion implantation dose exceeds 5E18 ions/$cm^2$, epitaxial lateral overgrowth of the metal nitride thin film is excessively performed, so that the metal nitride thin film can be formed with protrusions on the surface thereof.

Next, an $In_xAl_yGa_{1-x-y}N$ layer ($0.3 \geq x \geq 0$, $y \geq 0.1$, $x+y \leq 1$) (not shown) is formed over the surface of the silicon substrate 100 that includes the ion implantation region 120. The $In_xAl_yGa_{1-x-y}N$ layer serves as a buffer layer for growth of the metal nitride thin film.

Then, a metal nitride thin film 130 is formed over the surface of the silicon substrate 100 that includes the $In_xAl_yGa_{1-x-y}N$ layer. That is, a metal nitride is grown through epitaxial lateral overgrowth from a region of the silicon substrate 100 where the ion implantation region 120 is not formed, towards a region of the silicon substrate where the ion implantation region 120 is formed, thereby forming the metal nitride thin film 130. The metal nitride thin film 130 may comprise at least one selected from GaN, InGaAlN, InGaN, AlGaN, and AlN. The metal nitride thin film 130 may be formed by one selected from Metal Organic Chemical Vapor Deposition (MOCVD), Molecular Beam Epitaxy (MBE), Hydride Vapor Phase Epitaxy (HVPE), and Atomic Layer Deposition (ALD).

Then, diode structure layers 140 for constituting an electronic device such as a light emitting diode are formed on the metal nitride thin film 130. The diode structure layers 140 include a lower cladding layer, an active layer, and an upper cladding layer.

Next, it will be proven with reference to SEM micrographs that examples of metal nitride thin films formed by the method of forming a metal nitride thin film according to the embodiment of this invention have reduced dislocation density and stable crystallinity. In the examples, a gallium nitride thin film was representatively used as the metal nitride thin film.

Example 1

First, an ion implantation region of a line/space pattern is formed on a single crystal silicon substrate by the method according to the present invention. Here, a space pattern had a width of 11 μm and a line pattern given as an ion implantation region had a width of 5 μm.

Then, after forming an ion implantation mask of 10 μm thickness on the silicon substrate, ion implantation was performed to a thickness of 100 nm at a nitrogen ion dose of 5E17 ion/cm$^2$ at an ion implantation energy of 37.5 keV.

Then, after removing the mask from the silicon substrate, the silicon substrate was washed using acetone, methanol, and deionized water in this order, and was then dried using nitrogen gas.

Next, an AlN layer of 100 μm thickness and a GaN thin film of 1~1.2 μm thickness were sequentially formed on the dried silicon substrate within an MOCVD chamber.

Figure 6A:
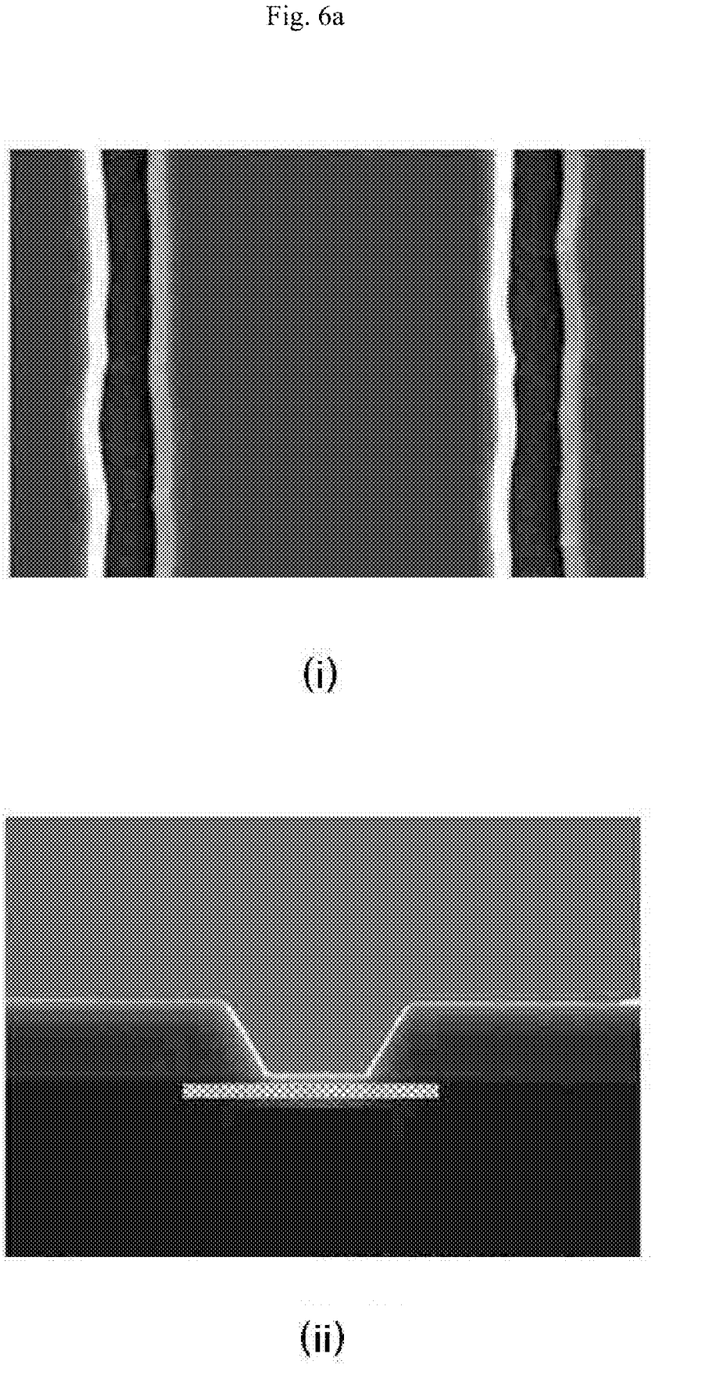
FIGS. 6a to 6c are SEM micrographs showing an upper surface and a cross-section of a GaN thin film of Example 1 during the formation of the GaN thin film.
Figure 6B:
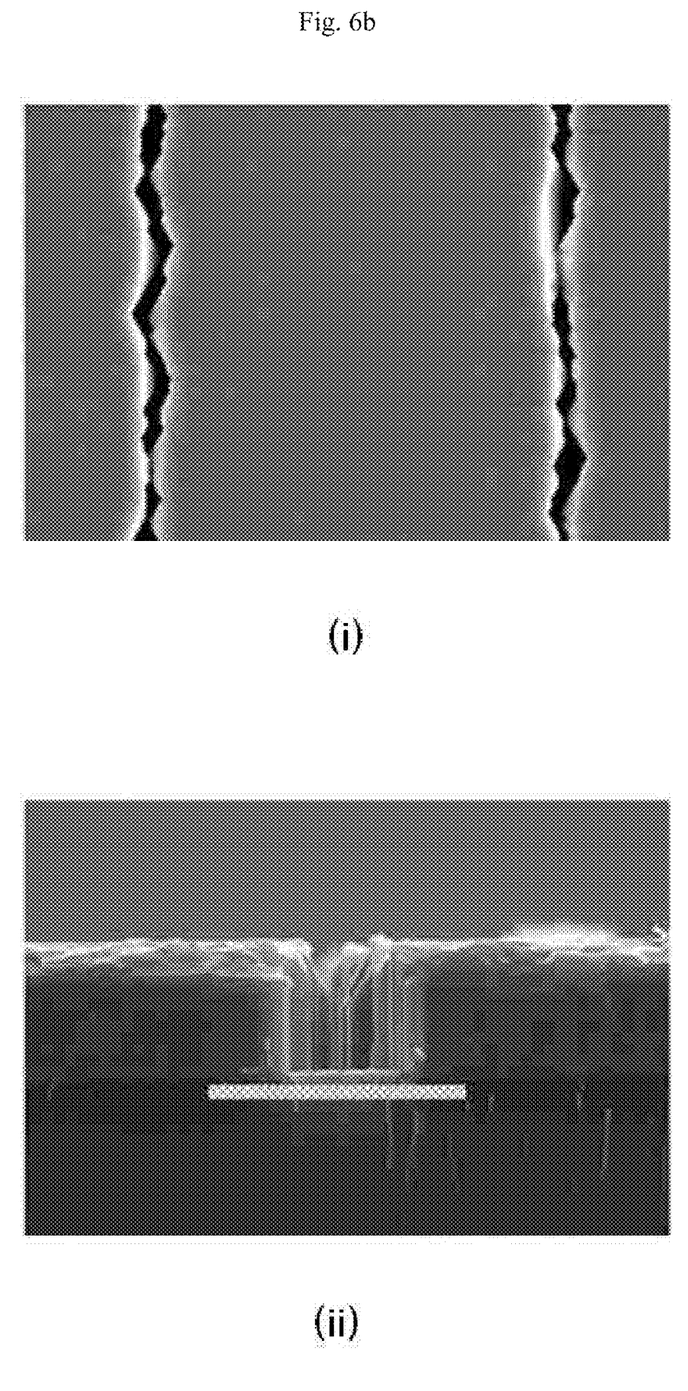
Figure 6C:
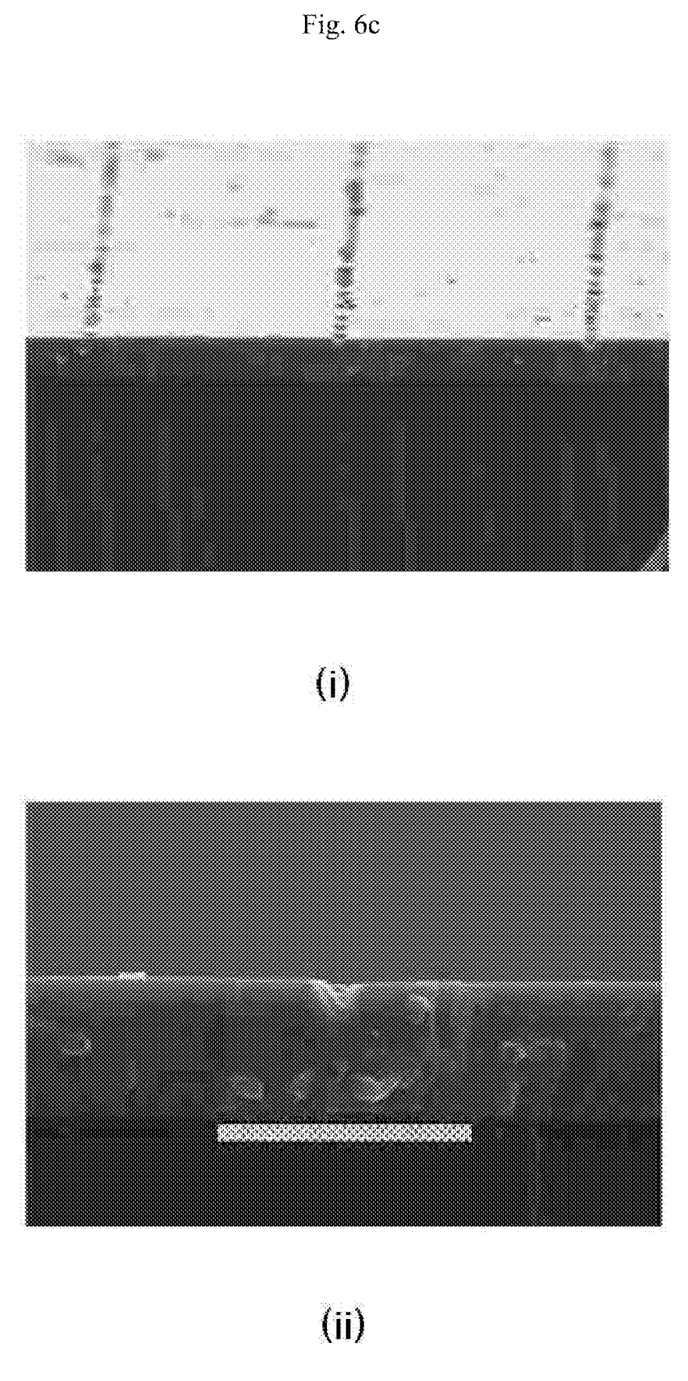

FIGS. 6a to 6c are SEM micrographs showing an upper surface and a cross-section of a GaN thin film of Example 1 during the formation of the GaN thin film. FIG. 6a (i), FIG. 6b (i) and FIG. 6c (i) show the upper surface of the GaN thin film of Example 1, and FIG. 6a (ii), FIG. 6b (ii) and FIG. 6c (ii) show the cross-section thereof.

FIG. 6a shows the GaN thin film grown to about 1 μm when 40 minutes elapsed after starting growth. In FIG. 6a, it can be seen that the GaN thin film was not substantially grown on the ion implantation region.

It can also be seen that the lateral overgrowth speed of the GaN thin film is substantially the same as the vertical growth speed of the GaN thin film on the region of the silicon substrate where the ion implantation region is not formed.

FIG. 6b shows the GaN thin film grown to about 2 μm when 80 minutes elapsed after starting growth, and shows a state immediately before the GaN thin films grown at the opposite sides of the ion implantation region by the epitaxial lateral overgrowth met each other.

FIG. 6c shows the GaN thin film grown to about 2.5 μm when 100 minutes elapsed after starting growth, and shows the GaN thin film that was completely grown.

Figure 7A:
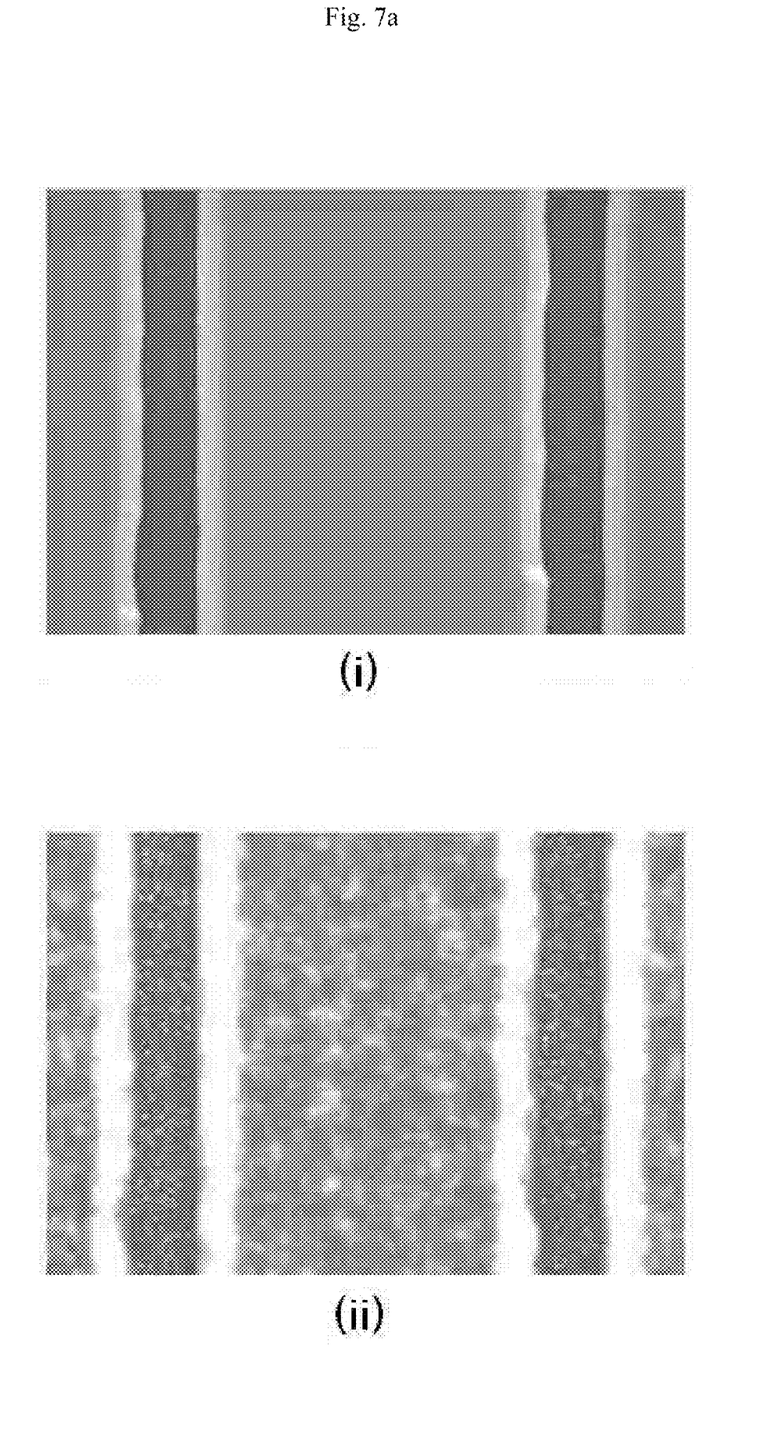
FIGS. 7a to 7c are SEM micrographs showing an upper surface of a GaN thin film during the formation of the GaN thin film according to an embodiment of the present invention, and cathode luminescence (CL) of the thin film.
Figure 7B:
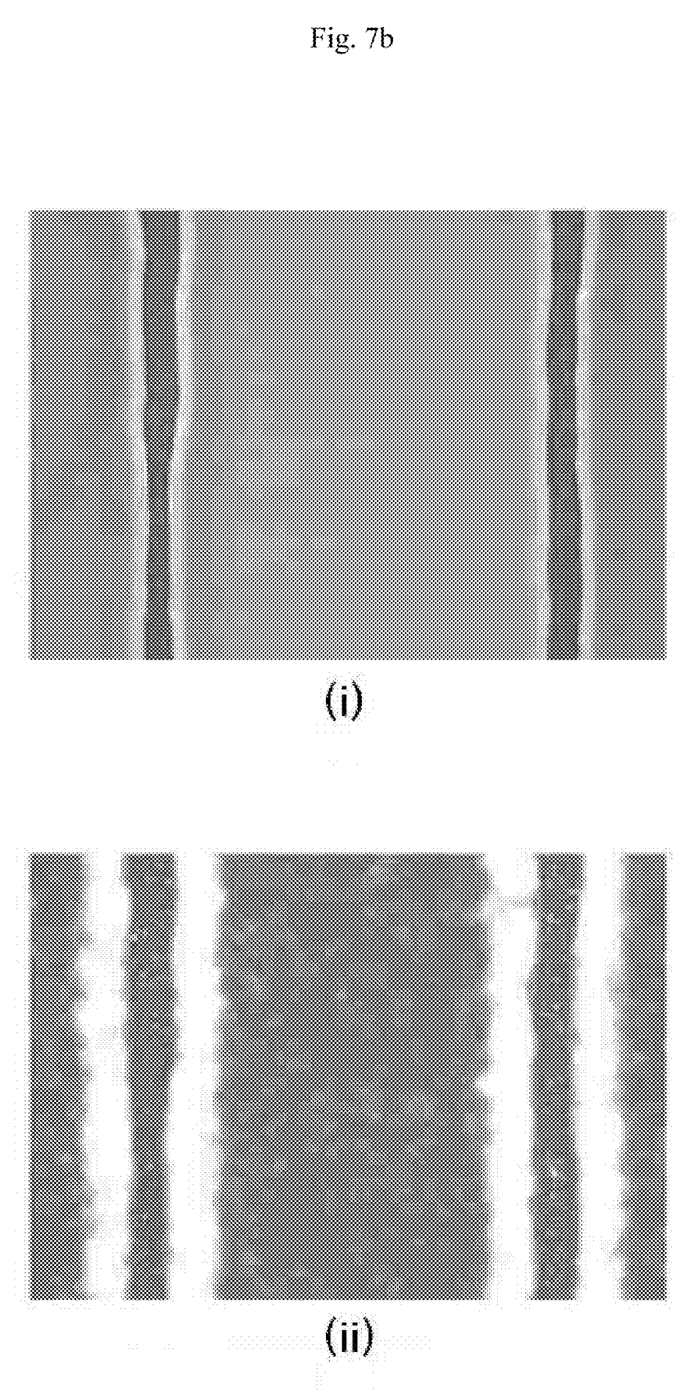
Figure 7C:
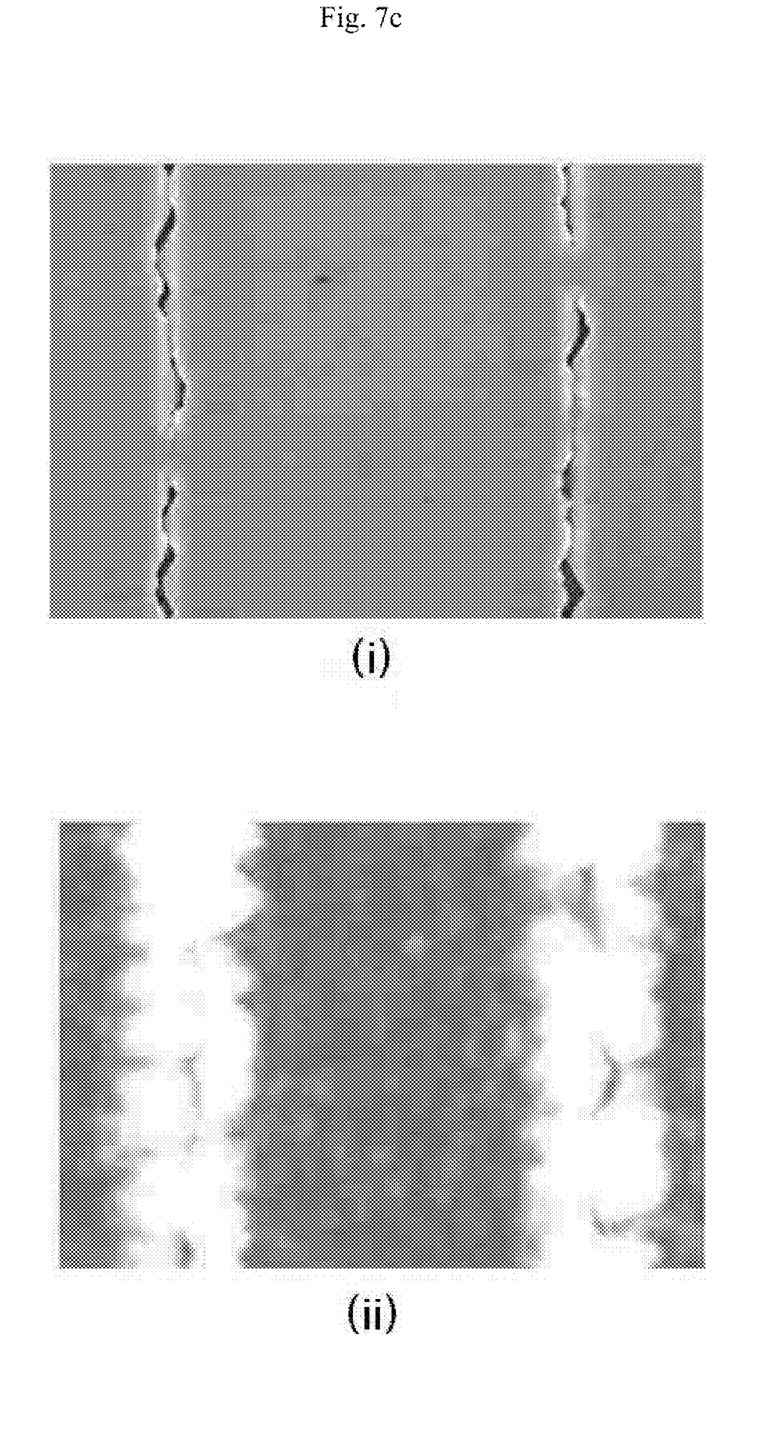

FIGS. 7a to 7c are SEM micrographs showing an upper surface of a GaN thin film during the formation of the GaN thin film according to an embodiment of the present invention, and cathode luminescence (CL) of the thin film. FIG. 7a (i), FIG. 7b (i) and FIG. 7c (i) show an upper surface of the GaN thin film.

It can be seen From FIGS. 7a to 7c that the GaN thin film grown by the epitaxial lateral overgrowth gradually decreased in dislocation density and thus exhibited clearer cathode luminescence.

Figure 8:
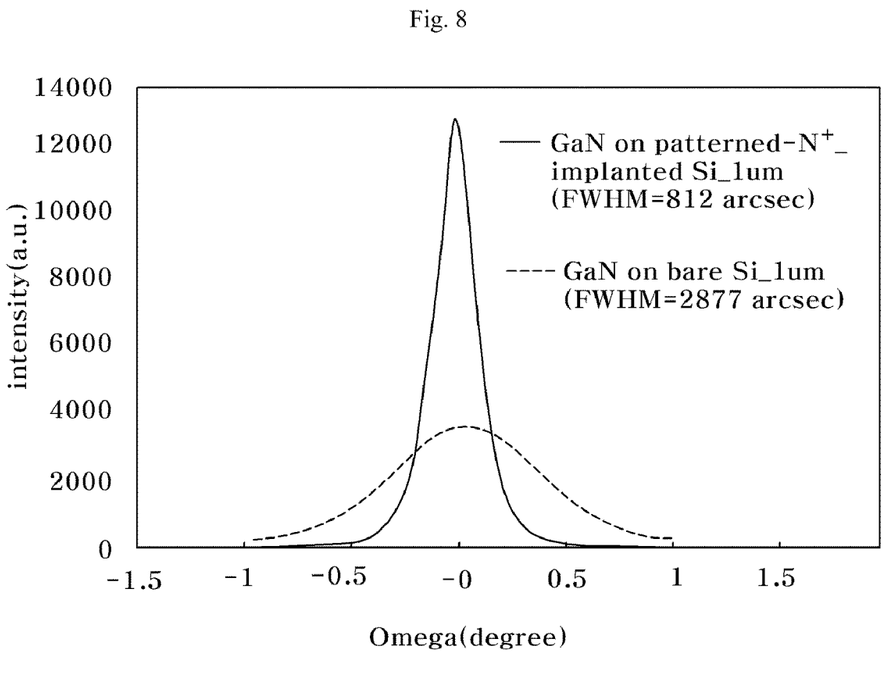
FIG. 8 is a graph depicting X-ray rocking curves of GaN thin films formed on a silicon substrate including an ion implantation region according to an embodiment of the present invention and on a silicon substrate that does not include the ion implantation region, respectively.

FIG. 8 is a graph depicting X-ray rocking curves of GaN thin films formed on a silicon substrate including an ion implantation region according to an embodiment of the present invention and on a silicon substrate that does not include the ion implantation region, respectively.

FIG. 8 shows crystallinity of the GaN thin films with the epitaxial lateral overgrowth regions shown in FIGS. 6a to 7c as measured by high resolution XRD. In FIG. 8, an X-ray rocking curve of a GaN thin film formed on a line pattern provided as the ion implantation region of the silicon substrate is compared with that of a GaN thin film formed on a space pattern of the silicon substrate.

Comparing XRD full-widths at half-maximum when the GaN thin film was grown to a thickness of 1 μm, the GaN thin film grown on the ion implantation region of the silicon substrate has an XRD full-width at half-maximum of 812 arcsec, whereas the GaN thin film grown on the part of the silicon substrate not including the ion implantation region has an XRD full-width at half-maximum of 2877 arcsec. As a result, it can be seen that crystallinity of the GaN thin film is improved through the epitaxial lateral overgrowth.

Here, an XRD full-width at half-maximum exceeding 820 arcsec can have a negative influence on chip characteristics, and a lower XRD full-width at half-maximum means better crystallinity. Thus, according to the present invention, the GaN thin film may have an XRD full-width at half-maximum of 820 arcsec or less. On the other hand, since it is difficult for current technology to obtain a crystal having an XRD full-width at half-maximum of 200 arcsec or less, the epitaxial lateral overgrowth of the GaN thin film may be controlled to lower the XRD full-width at half-maximum below 820 arcsec as much as possible.

As described above, since the ion implantation region decreases stress or prevents non-uniform concentration of the stress with regularity in distribution of nitrogen ions therein, uniform nucleation of a metal nitride thin film can be obtained. In other words, it is possible to relieve lattice mismatch of the metal nitride thin film not only on the surface of the silicon substrate subjected to ion implantation, but also on the part of the silicon substrate that is not subjected to nitrogen ion implantation.

Such alleviation of lattice mismatch affects other structures of a light emitting diode formed on the metal nitride thin film, thereby improving optical characteristics of the light emitting diode.

A nitride semiconductor including a metal nitride thin film according to an embodiment of the invention is diced into individual chips, which in turn are separated from each other, thereby providing chips for light emitting diodes. Then, each of the chips is mounted on a lead frame.

Then, the lead frame is formed to a cathode electrode, and an anode electrode is formed to connect with an upper part of the chip via a gold wire.

Then, a light emitting diode is formed by molding an epoxy resin in a shell shape to protect the chip, the lead frame, and an upper portion of the anode connected to the gold wire. Here, an upper portion of the shell is formed to act as a lens so as to promote luminescence.

The light emitting diode fabricated using the chip of the nitride semiconductor according to the present invention includes the GaN thin film having improved crystallinity, thereby providing superior optical characteristics.

As such, examples of the electronic device employing the nitride semiconductor as a chip include a Heterojunction Field-Effect Transistor (HEMT) and a Heterojunction Bipolar Transistor (HBT). Further, the nitride semiconductor including the metal nitride thin film may be applied to a light emitting diode and a laser diode. Since the electronic device includes the metal nitride thin film having improved crystallinity, the electronic device can exhibit excellent optical properties.

As apparent from the above description, according to an embodiment of the present invention, a metal nitride thin film is grown on a single crystal silicon substrate through epitaxial lateral overgrowth after forming an ion implantation region of a line/space pattern on the silicon substrate, so that the metal nitride thin film can be stably formed without using a mask such as $SiO_2$ or $Si_3N_4$.

The material used for the mask can act as a potential contaminant and generate stress in the GaN thin film, thereby causing defects in the metal nitride thin film. On the contrary, according to the embodiment of the present invention, the metal nitride thin film is grown on a flat surface of the silicon substrate through epitaxial lateral overgrowth without superficial deformation of the substrate, thereby reducing dislocation density in the metal nitride film while enhancing crystallinity thereof.

Although some embodiments have been provided to illustrate the present invention, this invention is not limited to the embodiments. Further, it will be apparent to those skilled in the art that various modifications, changes, and substitutions can be made without departing from the spirit and scope of the present invention. Accordingly, it should be understood that the embodiments set forth herein are given by way of illustration only, and do not limit the scope of the present invention.

What is claimed is:

1. A method of forming a nitride semiconductor, comprising:
    forming an ion implantation region of a line/space pattern in a substrate by implanting ions into the substrate at an ion implantation dose between 1E17 ions/$cm^2$ and 5E18 ions/$cm^2$ and an ion implantation energy of 30~50 keV;
    forming an $In_xAl_yGa_{1-x-y}N$ layer ($0.3 \geq x \geq y \geq 0.1$, $x+y \leq 1$) on the surface of the substrate; and
    forming a metal nitride thin film over the surface of the substrate including the $In_xAl_yGa_{1-x-y}N$ layer by allowing the metal nitride thin film to grow from an upper portion of the space pattern to an upper portion of the line pattern through epitaxial lateral overgrowth.

2. The method according to claim 1, wherein the substrate is one selected from a Si substrate, a sapphire substrate, a SiC substrate, a GaAs substrate, an InP substrate, and a Ge substrate.

3. The method according to claim 1, wherein an ion implanted into the ion implantation region is any selected from the group consisting of N, C, B, Be, Li, Mg, O, F, S, P, As, Sr, Te and combination thereof.

4. The method according to claim 1, wherein the ion implantation region is formed to a depth of 50 nm~1 μm from the surface of the substrate.

5. The method according to claim 1, wherein the ion implantation region is formed to a depth of 50 nm~200 nm from the surface of the substrate.

6. The method according to claim 1, wherein the metal nitride thin film comprises at least one material selected from GaN, InGaAlN, InGaN, AlGaN and AlN.

7. The method according to claim 1, wherein the metal nitride thin film is formed by one selected from MOCVD, MBE, HYPE, and ALD.

8. The method according to claim 1, wherein the metal nitride thin film is grown to have an XRD full-width at half-maximum of 820 arcsec or less.

9. The method according to claim 1, further comprising:
    forming a lower cladding layer, an active layer, and an upper cladding layer on the metal nitride thin film in this order.

10. An optical device manufactured using a nitride semiconductor including the metal nitride thin film formed by the method according to claim 1.

11. An electronic device manufactured using a nitride semiconductor including the metal nitride thin film formed by the method according to claim 1.

12. An electronic device comprising:
    a chip fabricated by dicing a nitride semiconductor including a metal nitride thin film formed by the method according to claim 1 into individual chips and separating the individual chips from each other;
    a lead frame having the chip mounted thereon;
    a cathode connected to the lead frame;
    an anode separated from the cathode and connected to the chip via a gold wire; and
    an epoxy resin molded to protect the chip, the lead frame and an upper portion of the anode connected to the gold wire, and to serve as a lens which radiates light.

13. The optical device according to claim 10, wherein the optical device is one of a light emitting diode and a laser diode.

14. The electronic device according to claim 11, wherein the electronic device is one of a Heterojunction Field-Effect Transistor (HEMT), and a Heterojunction Bipolar Transistor (HBT).

* * * * *